(12) United States Patent
Yang

(10) Patent No.: US 10,937,754 B1
(45) Date of Patent: Mar. 2, 2021

(54) SEMICONDUCTOR PACKAGE AND MANUFACTURING METHOD THEREOF

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/594,059

(22) Filed: Oct. 6, 2019

(51) Int. Cl.
*H01L 23/31* (2006.01)
*H01L 23/00* (2006.01)

(52) U.S. Cl.
CPC .......... *H01L 24/46* (2013.01); *H01L 23/3121* (2013.01); *H01L 24/05* (2013.01); *H01L 24/13* (2013.01); *H01L 24/81* (2013.01); *H01L 24/85* (2013.01)

(58) Field of Classification Search
CPC ...................................... H01L 24/46
See application file for complete search history.

(56) References Cited

U.S. PATENT DOCUMENTS

| 6,380,615 | B1 * | 4/2002 | Park | H01L 24/743 |
| | | | | 257/686 |
| 2002/0149097 | A1 * | 10/2002 | Lee | H01L 25/0652 |
| | | | | 257/686 |
| 2008/0265397 | A1 * | 10/2008 | Lin | H01L 24/73 |
| | | | | 257/691 |

\* cited by examiner

*Primary Examiner* — William A Harriston
(74) *Attorney, Agent, or Firm* — CKC & Partners Co., LLC

(57) ABSTRACT

A semiconductor package is provided which includes a package substrate, a first die, a second die, an interconnection member and a number of bonding wires. The first die is disposed on the package substrate. The second die is disposed over the first die. The interconnection member is configured for coupling the first die and the second die and comprises a first connection plate, a second connection plate and a bump. The first connection plate is connected to the first die. The second connection plate is connected to the second die. The bump couples the first connection plate and the second connection plate. The bonding wires couple the interconnection member to the package substrate, the first die and the second die.

20 Claims, 9 Drawing Sheets

SEMICONDUCTOR PACKAGE AND MANUFACTURING METHOD THEREOF

BACKGROUND

Field of the Invention

This disclosure is relates generally to semiconductor chip packages and manufacturing method thereof and, more particularly, to a molded semiconductors chip packages without a presence of a conventional RDL layer for connecting two stacked chips and manufacturing method thereof.

Description of Related Art

Semiconductor devices are essential for many modern applications. With the advancement of electronic technology, semiconductor devices are becoming smaller in size while having greater functionality and greater amounts of integrated circuitry. Due to the miniaturized scale of semiconductor devices, chip-on-chip technique is now widely used for manufacturing semiconductor devices. Numerous manufacturing steps are undertaken in the production of such semiconductor packages.

However, the manufacturing of semiconductor devices in a miniaturized scale is becoming more complicated. Any increase in the complexity of manufacturing a semiconductor device may cause deficiencies such as poor electrical interconnection or increasing manufacturing cost. As such, there are many challenges for modifying the structure and manufacture of semiconductor devices.

SUMMARY

One aspect of the current disclosure provides a semiconductor package which includes a package substrate, a first die, a second die, an interconnection member and a number of bonding wires. The first die is disposed on the package substrate. The second die is disposed over the first die. The interconnection member is configured for coupling the first die and the second die and comprises a first connection plate, a second connection plate and a bump. The first connection plate is connected to the first die. The second connection plate is connected to the second die. The bump couples the first connection plate and the second connection plate. The bonding wires couple the interconnection member to the package substrate, the first die and the second die.

In some embodiments, the first connection plate has a first through hole to expose a bonding pad of the first die, and one of the bonding wire passes through the first through hole for coupling the bonding pad of the first die to the first connection plate. In addition, the second connection plate has a second through hole to expose a bonding pad of the second die, and one of the bonding wire passes through the second through hole for coupling the bonding pad of the second die to the second connection plate. The first through hole is aligned with the second through hole in a direction that is perpendicular to the package substrate, and the first through hole is to expose a plurality of bonding pads of the first die, and the second through hole is to expose a plurality of bonding pads on the second die.

In some embodiments, each of the first connection plate and the second connection plate comprises a supporting layer and an electrode disposed on the corresponding supporting layer. The first connection plate and the second connection plate are respectively connected to the first die and the second die via an adhesive material. In addition, the electrode of the first connection plate and the electrode of the second connection plate are connected to two sides of the bump. The electrode of the first connection plate is connected to the package substrate and the first die via two of the bonding wires, and the electrode of the second connection plate is connected to the electrode of the second connection plate via one of the bonding wires.

In some embodiments, comprising an encapsulating material, and the first die, the second die, the interconnection member and the bonding wires are encapsulated within the encapsulating material.

Another aspect of the current disclosure provides a method for manufacturing a semiconductor package of any embodiment mentioned above. The method includes providing a package substrate and placing a first die on the package substrate. The method also includes placing a second die over the first die and coupling the first die and the second die via an interconnection member. Specifically, a first connection plate of the interconnection member is connected to the first die, a second connection plate of the interconnection member is connected to the second die, and a bump of the interconnection member connects the first connection plate and the second connection plate. In addition, the method includes coupling the interconnection member to the package substrate, the first die and the second die via a plurality of bonding wires.

It is to be understood that both the foregoing general description and the following detailed description are by examples, and are intended to provide further explanation of the invention as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 2:
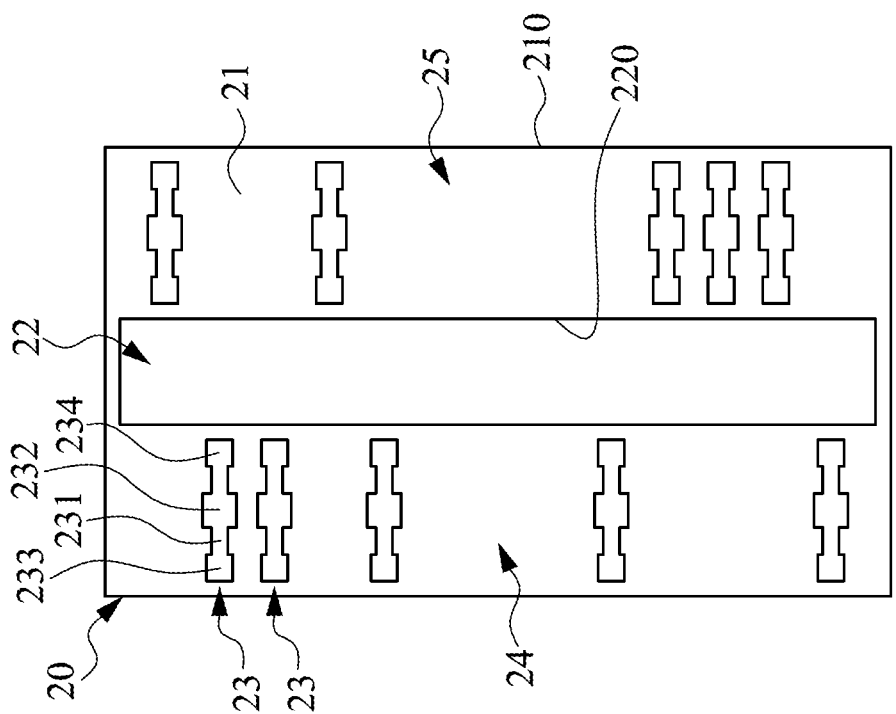
FIGS. 1-5 are schematic views of a method for manufacturing a lower portion of a semiconductor package at different stages, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A method for manufacturing a semiconductor package is described below, in accordance with some embodiments of the disclosure.

Figure 1:
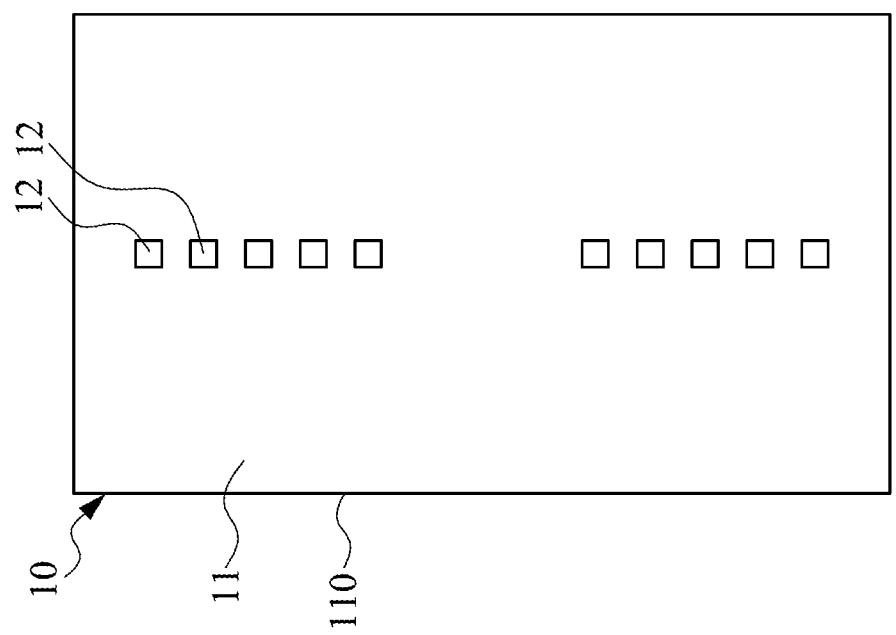

FIGS. 1-5 are schematic views of a method for manufacturing a lower portion of a semiconductor package at different stages, according to some embodiments of the present disclosure. As shown in FIG. 1, the preparation of the lower portion of the semiconductor package begins with providing a first die 10. The first die 10 may include a semiconductor substrate made of semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used.

In addition, the first die 10 may also include an electronic layer. The electronic layer may include a number of microelectronic elements. Examples of the microelectronic elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and other suitable processes. The microelectronic elements are interconnected to form an integrated circuit, such as a logic device, memory device (e.g., SRAM), RF device, input/output (I/O) device, system-on-chip (SOC) device, system-in-chip (SIC) device, combinations thereof, and other suitable types of devices.

In some embodiments, the first die 10 further includes a number of bonding pads 12 formed on an active surface 11 of the first die 10. In some embodiments, the bonding pads 12 are electrically connected to the microelectronic elements in the first die 10 and aligned along a central region of the active surface 11. The bonding pads 12 represent any of the various terminals commonly formed near the surface of a semiconductor die through which electrical connections are made between integrated circuit in the die and external circuits.

As shown in FIG. 2, the preparation of the lower portion of a semiconductor package further includes providing a first connection plate 20. In some embodiments, the first connection plate 20 includes a supporting layer 21 and a number of electrodes 23. A through hole 22 is formed on the supporting layer 21. The through hole 22 is located at a central region of the supporting layer 21, and two operation regions 24 and 25 are located at two sides of the through hole 22. Each of the two operation regions 24 and 25 may connect an inner edge 220 to the outer edge 210 of the supporting layer 21.

The electrodes 23 are arranged on either the operation region 24 or the operation region 25 according to pads arrangement of a package substrate (as described later). In some embodiments, each of the electrodes 23 includes a connecting portion 231, a bump contact 232 and two wire contacts 233 and 234. The connecting portion 231 may have a strip shape, and an extension direction of the connecting portion 231 may be perpendicular to the inner edge 220 and the outer edge 210. The bump contact 232 is formed on a center of the connecting portion 231. The wire contact 233 is formed on one end of the connecting portion 231 that is adjacent to the outer edge 210, and the wire contact 233 is formed on the other end of the connecting portion 231 that is adjacent to the inner edge 220. The bump contact 232 and the wire contacts 233 and 234 may have greater width than the connecting portion 231 for facilitating electronic connection of conductive elements.

Figure 3:
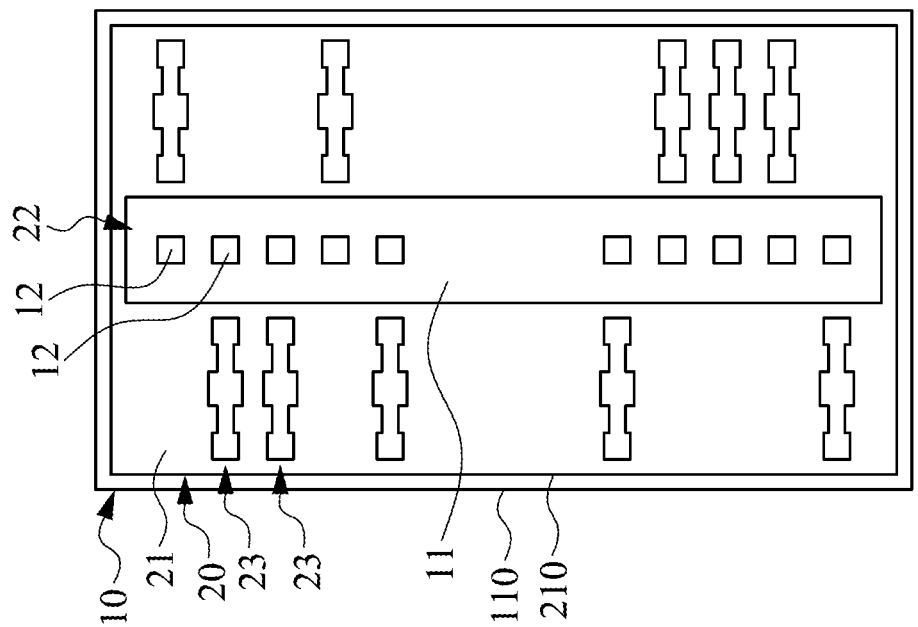

As shown in FIG. 3, the preparation of the lower portion of a semiconductor package further includes connecting the first connection plate 20 to the first die 10. In some embodiments, a back surface of the supporting layer 21 that is opposite to the surface where electrodes 23 are located is in direct contact with the active surface 11 of the first die 10. The supporting layer 21 may be attached to active surface 11 of the first die 10 by an adhesive layer (not shown) using conventional processes known in the art. After the first die 10 and the first connection plate 20 are assembled, the through hole 22 of the first connection plate 20 is to expose one or more than one bonding pads 12, and each of the bonding pads 12 is located adjacent to one of the electrodes 23. The supporting layer 21 may be a printed-circuit board. In some embodiments, the supporting layer 21 may be made of be a ceramic, an organic, glass and/or semiconductor material or structure.

In some embodiments, the supporting layer 21 has a size that is substantially the same as that of the active surface 11, and the outer edge 210 of the supporting layer 21 overlapped with the outer edge 110 of the first die 10 after the first die 10 and the first connection plate 20 are assembled. However, it should be appreciated that many variations and modifications can be made to embodiments of the disclosure. In cases where the supporting layer 21 has a smaller size than that of the active surface 11, the outer edge 210 of the supporting layer 21 may be distant from the outer edge 110 of the active surface 11 after the first die 10 and the first connection plate 20 are assembled.

Figure 4:
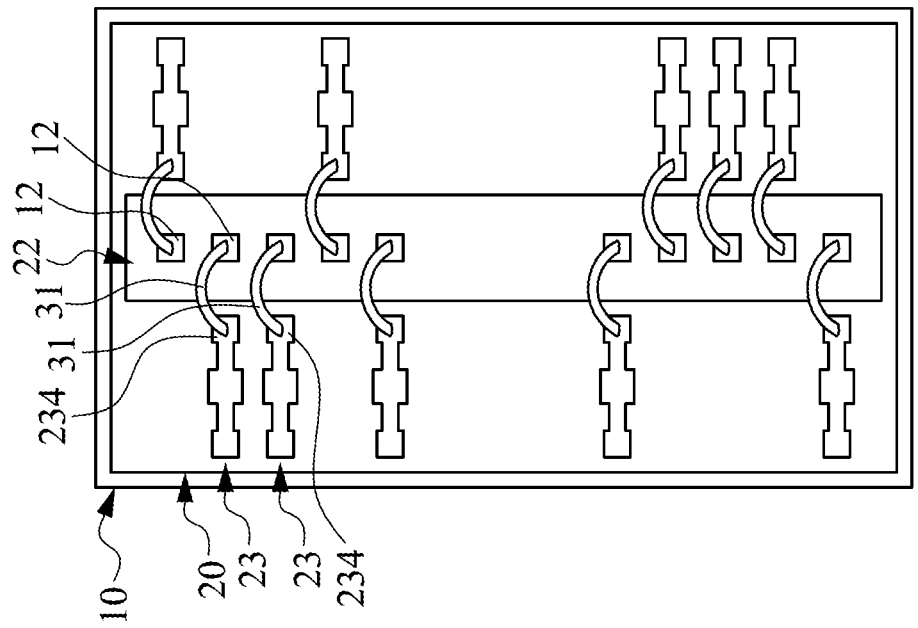

As shown in FIG. 4, the preparation of the lower portion of a semiconductor package further includes coupling the first connection plate 20 to the first die 10. In some embodiments, a number of bonding wires 31 are used to connect the first connection plate 20 to the first die 10. Specifically, each of the bonding wires 31 is formed from one of the bonding pads 12 to a neighboring wire contact 234. The bonding wire 31 may pass through the through hole 22, and at least a portion of a vertical projection of each of the bonding wires 31 is located within the through hole 22.

Figure 5:
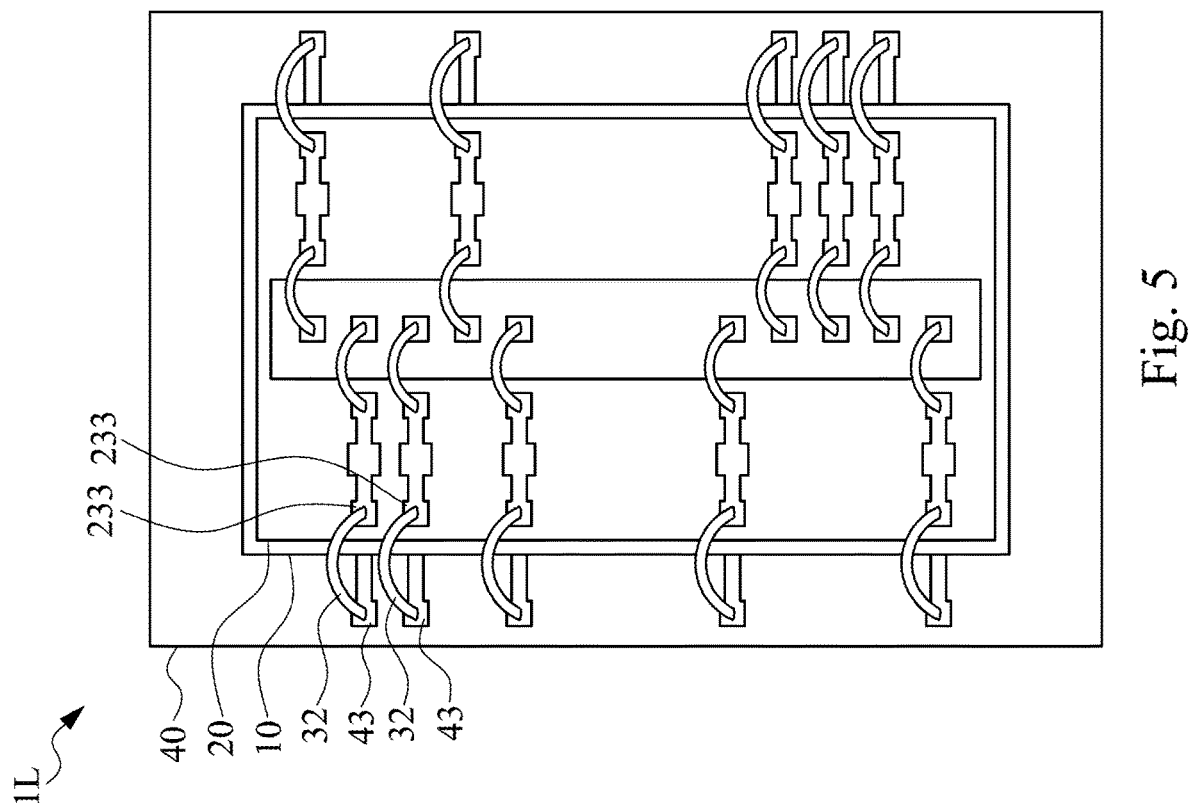

As shown in FIG. 5, the preparation of the lower portion of a semiconductor package further includes placing the first die 10 along with the first connection plate 20 to a package substrate 40. In some embodiments, the package substrate 40 may be a printed-circuit board, a ceramic, an organic, glass, and/or semiconductor material or structure, which provide a backplane with power, ground, control, monitoring, etc.

In some embodiments, the package substrate 40 includes electrical routing features such as pads 43 or trace layers (not shown) to route electrical signals to or from the first die 10. After the first die 10 is placed on the package substrate 40, a number of bonding wires 32 are used to connect the first die 10 to the package substrate 40 by forming the bonding wires 32 from one the pad 43 to a neighboring wire contact 233. As such, the lower portion 1L of a semiconductor package is formed. The package substrate 40 may further includes a number of solder balls 45 (FIG. 12) formed on a bottom surface of the package substrate 40 for routing signals to route electrical signals to other electrical devices (e.g., motherboard or other chipset).

FIGS. 6-10 are schematic views of a method for manufacturing an upper portion of the semiconductor package at different stages, according to some embodiments of the present disclosure.

Figure 6:
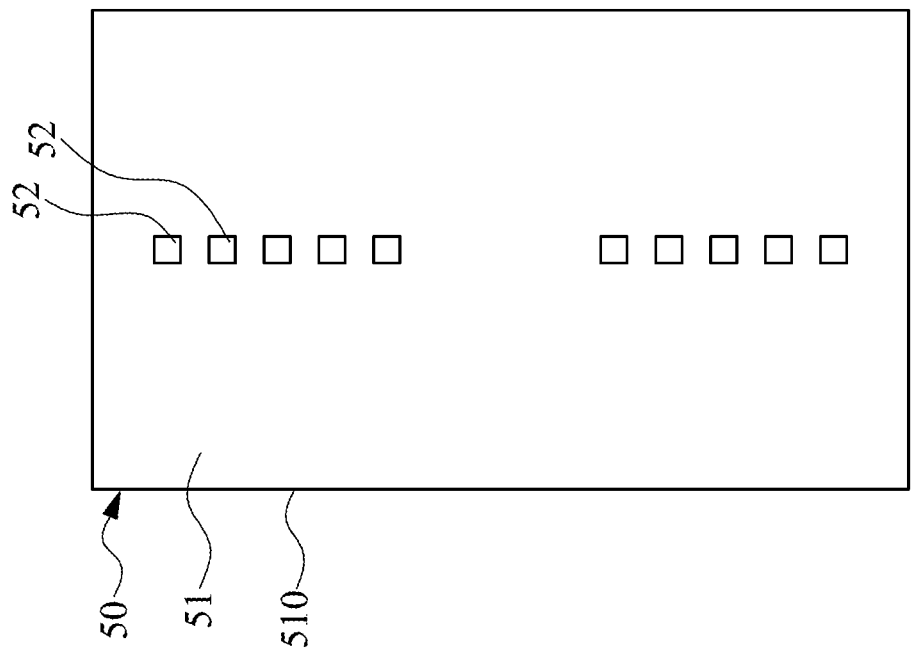

As shown in FIG. 6, the preparation of the upper portion of the semiconductor package begins with providing a second die 50. The second die 50 may include a semiconductor substrate made of semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used.

In addition, the second die 50 may also include an electronic layer. The electronic layer may include a number of microelectronic elements. Examples of the microelectronic elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and other suitable processes. The microelectronic elements are interconnected to form an integrated circuit, such as a logic device, memory device (e.g., SRAM), RF device, input/output (I/O) device, system-on-chip (SOC) device, system-in-chip (SIC) device, combinations thereof, and other suitable types of devices.

In some embodiments, the second die 50 further includes a number of bonding pads 52 formed on an active surface 51 of the second die 50. In some embodiments, the bonding pads 52 are electrically connected to the microelectronic elements in the second die 50 and aligned along a central region of the active surface 51. The bonding pads 52 represent any of the various terminals commonly formed near the surface of a semiconductor die through which electrical connections are made between integrated circuit in the die and external circuits.

Figure 7:
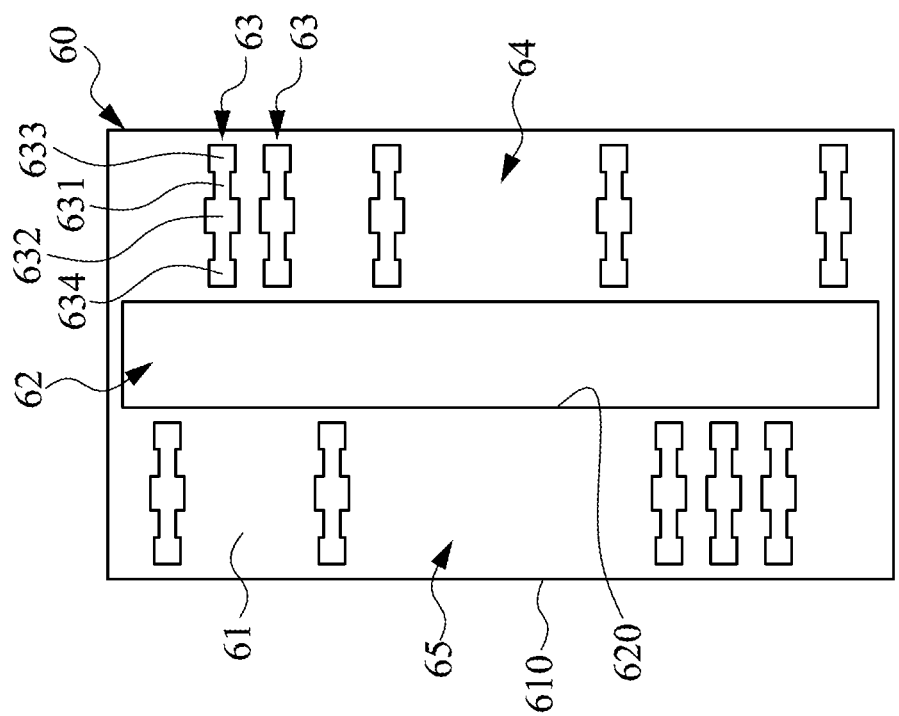
FIGS. 6-10 are schematic views of a method for manufacturing an upper portion of a semiconductor package at different stages, according to some embodiments of the present disclosure.

As shown in FIG. 7, the preparation of the upper portion of a semiconductor package further includes providing a second connection plate 60. In some embodiments, the second connection plate 60 includes a supporting layer 61 and a number of electrodes 63. A through hole 62 is formed on the supporting layer 61. The through hole 62 is located at a central region of the supporting layer 61, and two operation regions 64 and 65 are located at two sides of the through hole 62. Each of the two operation regions 64 and 65 may connect an inner edge 620 to the outer edge 610 of the supporting layer 61.

The electrodes 63 are arranged on either the operation region 64 or the operation region 65 according to pads arrangement of a package substrate (as described later). In some embodiments, each of the electrodes 63 includes a connecting portion 631, a bump contact 632 and two wire contacts 633 and 634. The connecting portion 631 may have a strip shape, and an extension direction of the connecting portion 631 may be perpendicular to the inner edge 620 and the outer edge 610. The bump contact 632 is formed on a center of the connecting portion 631. The wire contact 633 is formed on one end of the connecting portion 631 that is adjacent to the outer edge 610, and the wire contact 633 is formed on the other end of the connecting portion 631 that is adjacent to the inner edge 620. The bump contact 632 and the wire contacts 633 and 634 may have greater width than the connecting portion 631 for facilitating electronic connection of other conductive elements.

Figure 8:
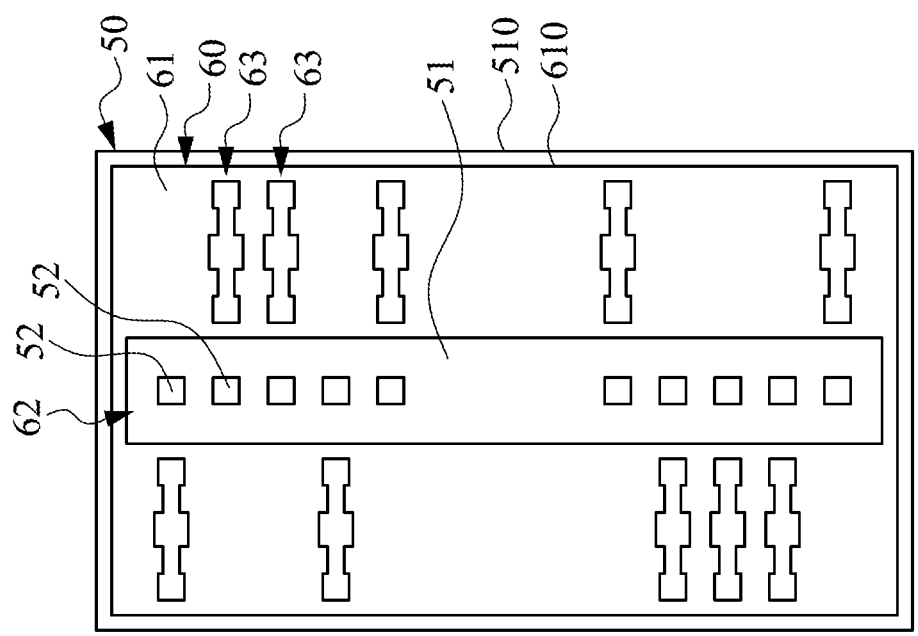

As shown in FIG. 8, the preparation of the upper portion of a semiconductor package further includes connecting the second connection plate 60 to the second die 50. In some embodiments, a back surface of the supporting layer 61 that is opposite to the surface where electrodes 63 are located is in direct contact with the active surface 51 of the second die 50. The supporting layer 61 may be attached to active surface 51 of the second die 50 by an adhesive layer (not shown) using conventional processes known in the art. After the second die 50 and the second connection plate 60 are assembled, the through hole 62 of the second connection plate 60 is to expose one or more than one bonding pads 52, and each of the bonding pads 52 is located adjacent to one of the electrodes 63. The supporting layer 61 may be printed-circuit board, a ceramic, an organic and/or glass.

In some embodiments, the supporting layer 61 has a size that is substantially the same as that of the active surface 51, and the outer edge 610 of the supporting layer 61 overlapped with the outer edge 510 of the second die 50 after the second die 50 and the second connection plate 60 are assembled. However, it should be appreciated that many variations and modifications can be made to embodiments of the disclosure. In cases where the supporting layer 61 has a smaller size than that of the active surface 51, the outer edge 610 of the supporting layer 61 may be distant from the outer edge 510 of the active surface 51 after the second die 50 and the second connection plate 60 are assembled.

Figure 9:
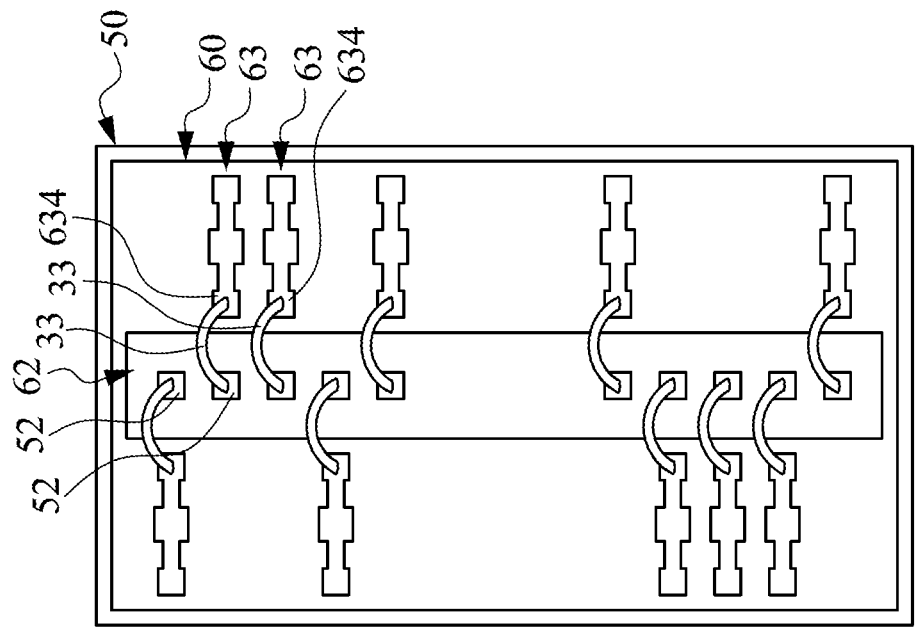

As shown in FIG. 9, the preparation of the upper portion of a semiconductor package further includes coupling the second connection plate 60 to the second die 50. In some embodiments, a number of bonding wires 33 are used to connect the second connection plate 60 to the second die 50. Specifically, each of the bonding wires 33 is formed from one of the bonding pads 52 to a neighboring wire contact 634. The bonding wire 33 may pass through the through hole 62, and at least a portion of a vertical projection of each of the bonding wires 33 is located within the through hole 62.

Figure 10:
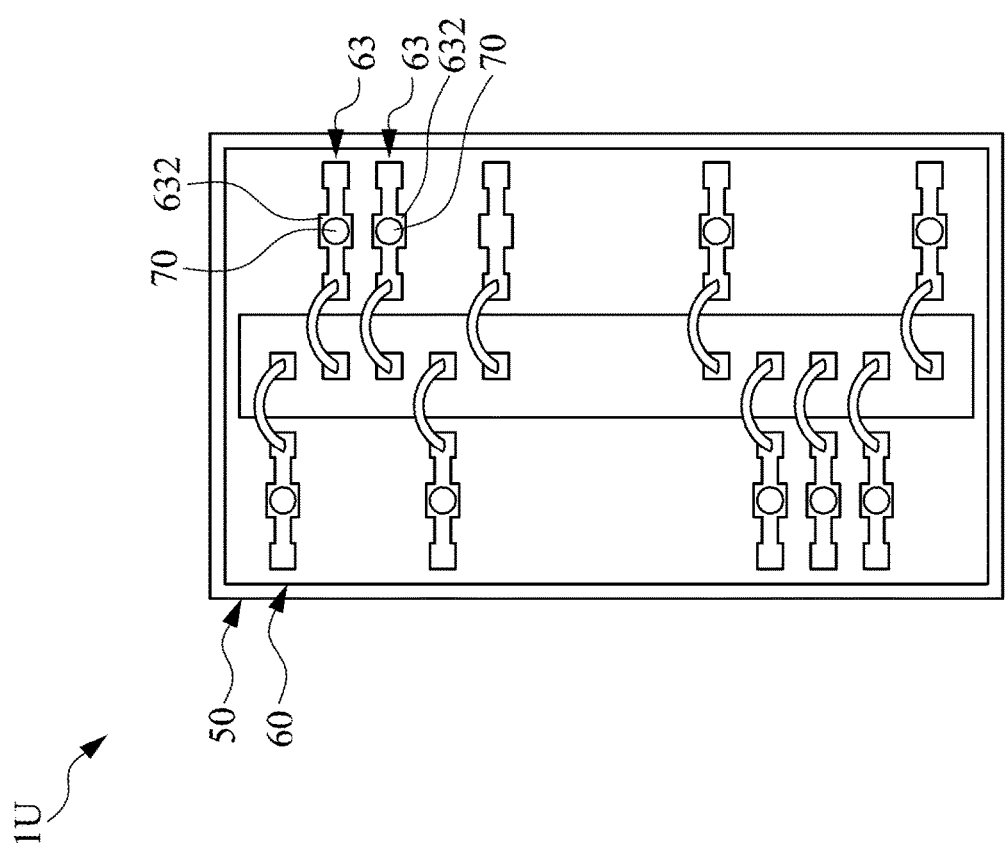

As shown in FIG. 10, the preparation of the upper portion of a semiconductor package further includes dispending bumps 70 on the bump contacts 632 of the electrodes 63. The bumps 70 may include solder balls. As such, the upper portion 1U of a semiconductor package is formed.

Figure 11:
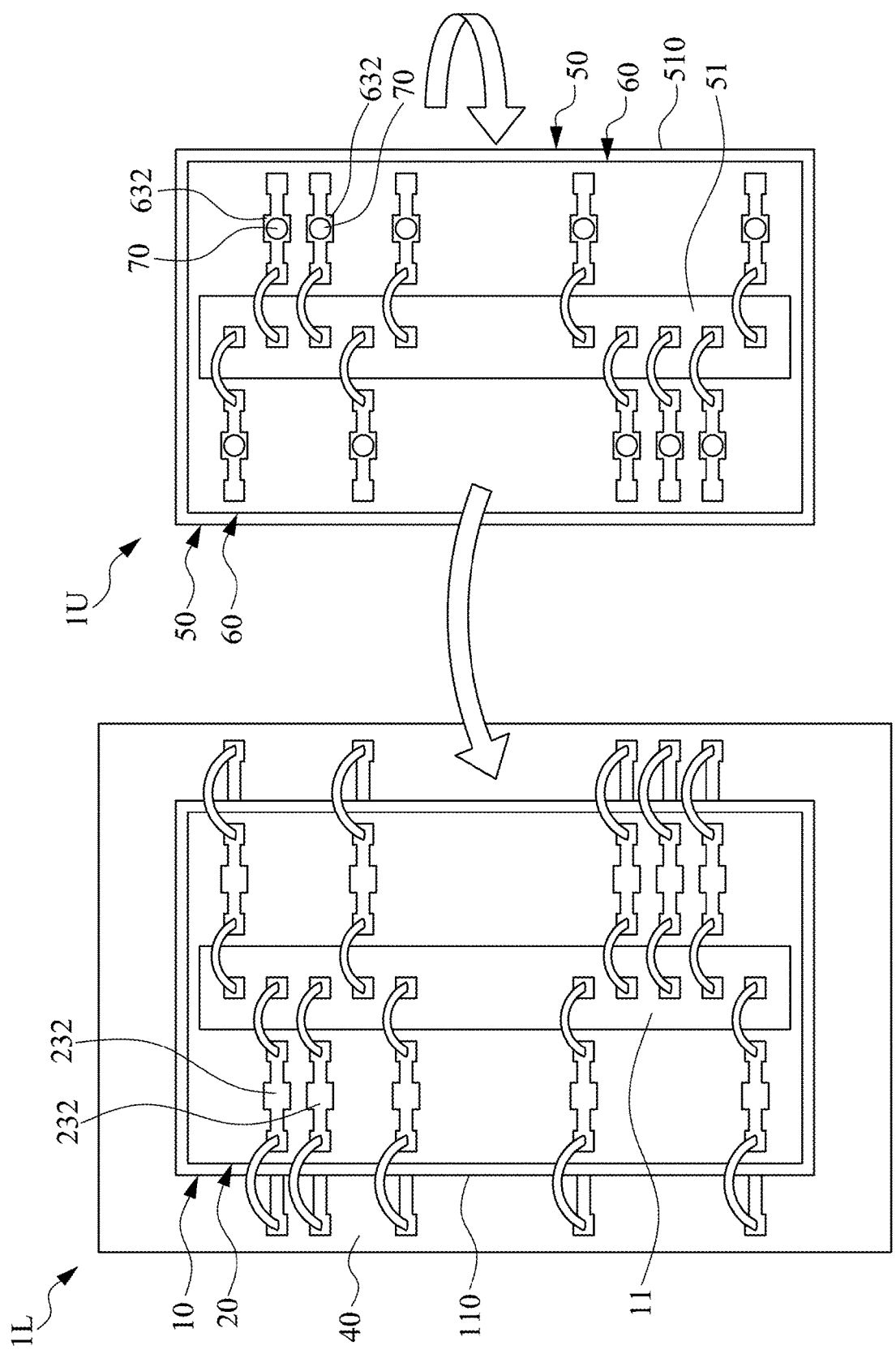
FIG. 11 is a schematic view of a method for packaging a semiconductor package at a stage for connecting an upper portion to a lower portion, according to some embodiments of the present disclosure.
Figure 12:
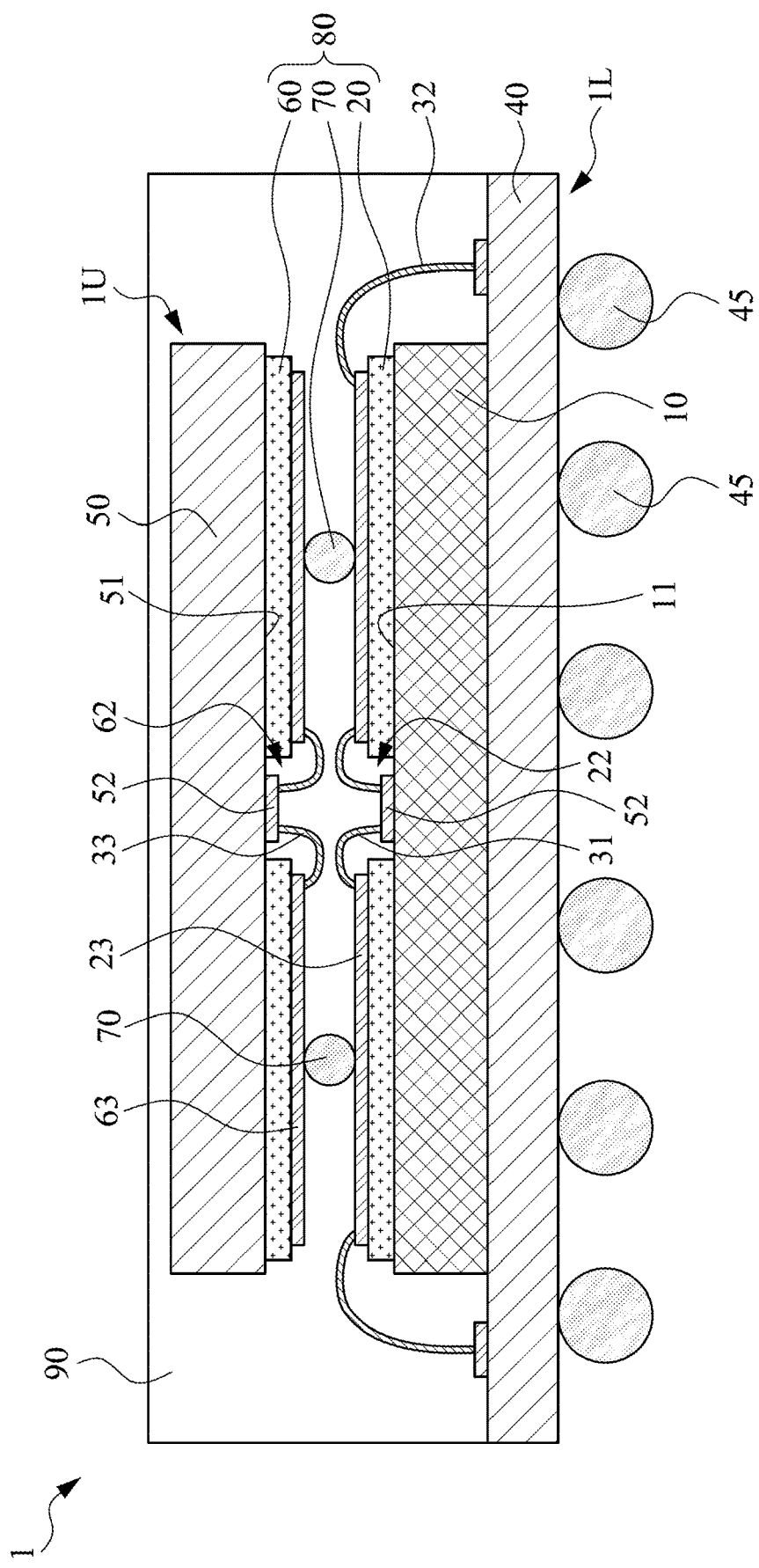
FIG. 12 is a cross-sectional view a semiconductor package, according to some embodiments of the present disclosure.

Referring to FIG. 11, after the completion of lower portion 1L and upper portion 1U, the method for manufacturing the semiconductor package 1 further includes assembling the lower portion 1L and upper portion 1U by turning the upper portion 1U upside down to make the bumps 70 be located between the two bump contacts 232 and 632, as shown in FIG. 12. In this disclosure, since the first connection plate 20, the second connection plate 60 and the bumps 70 are configured for routing signal between the first die 10 and the second die 50, the first connection plate 20, the second connection plate 60 and the bumps 70 are also referred to as "interconnection member 80".

Afterwards, the method for manufacturing the semiconductor package 1 further encapsulating the first die 10, the second die 50, the interconnection member 80 and the bonding wires 31, 32 and 33 by an encapsulating material 90. The encapsulating material 90 may include thermosetting epoxy resin. As such, a semiconductor package 1 is formed.

As shown in FIG. 12, when the upper portion 1U is stacked on the lower portion 1L, the active surface 11 of the first die 10 faces upwardly, and the active surface 51 of the second die 50 faces downwardly. The interconnection member 80 is positioned between the active surface 11 and the active surface 51. In addition, the through hole 22 of the first connection plate 20 is aligned with the through hole 62 of the second connection plate 60 in a direction that is perpendicular to the package substrate 40. The bonding wires 31 and 33 are located corresponding to the though holes 22 and 62.

It should be appreciated that while bonding wires 31, 32 and 33 are used to connect the package substrate 40 to the first die 10, and connect the first die 10 to the first connection plate 20, and connect the second die 50 to the second connection plate 60, the disclosure is not limited thereto. In some embodiments, vias (not shown) are formed in the first die 10, and the bonding wire 32 is omitted. The first die 10 is connected to the package substrate 40 via interconnects, such as bumps, that formed on the back surface of the first die 10. In some embodiments, one of the first connection plate 20 and second connection plate 60 is replaced by a redistribution layer (RDL) formed on the corresponding die, but the other one of the first connection plate 20 and second connection plate 60 is remained. The redistribution layer is connected to the bump 70 directly.

Figure 13:
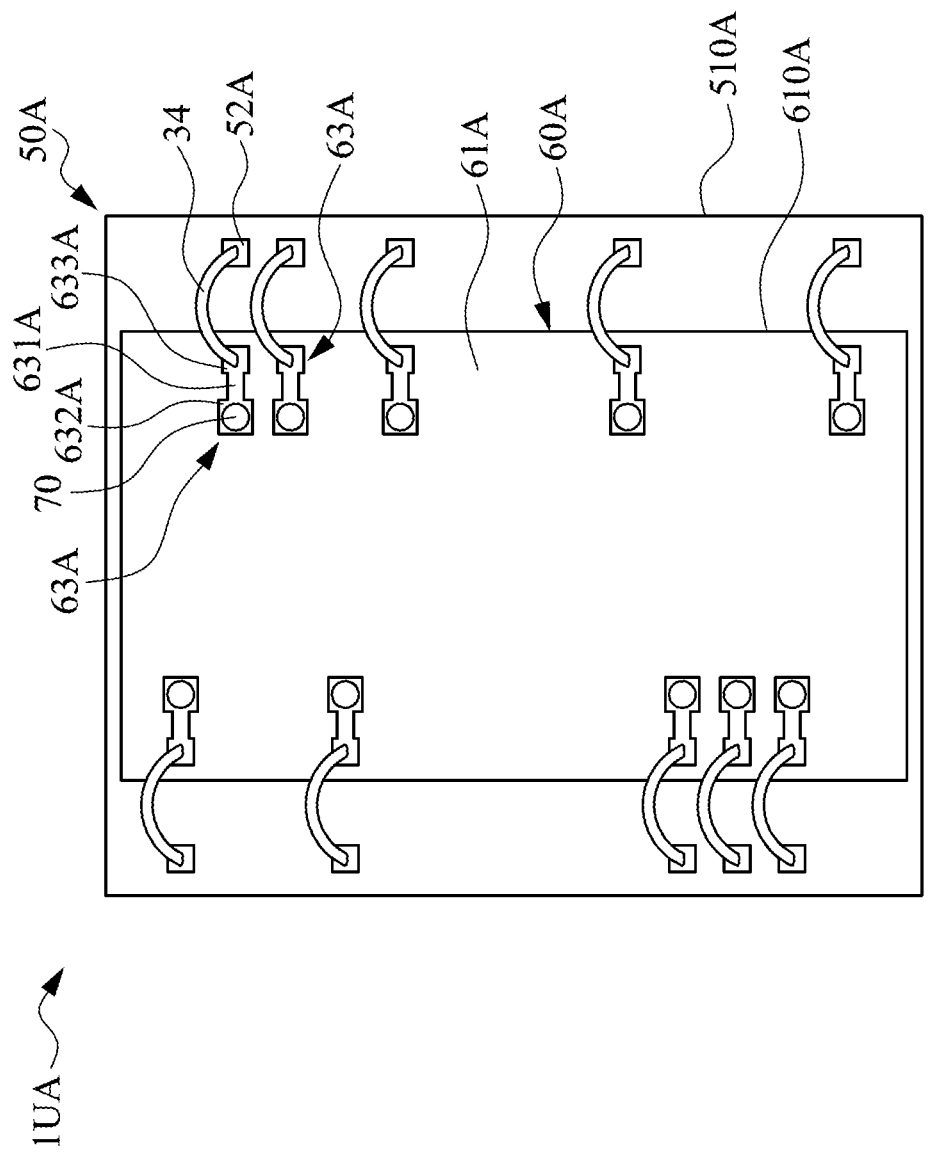
FIG. 13 is a top view of an upper portion of a semiconductor package, according to some embodiments of the present disclosure.

FIG. 13 is a top view of an upper portion of a semiconductor package, according to some embodiments of the present disclosure. The disclosure may also be incorporated into a die wherein the bonding pads 52A are located along the outer edge 510A of a second die 50A and wire bonded to adjacent electrodes 63A on a second connection plate 60A.

In one embodiment, a supporting layer 61A of the second connection plate 60A has no through hole formed on a central region, and the outer edge 610A of the supporting layer 61A is distant away from the outer edge 510A of the second die 50A. The bonding pads 52A are located between the outer edge 510A and the outer edge 610A. The electrode 63A includes a connecting portion 631A, a bump contact 632A and a wire contact 633A. The bump contact 632A and the wire contact 633A are connected to two ends of the connecting portion 631A. Bumps 70 are dispensed on the bump contacts 632A. Bonding wires 34 are formed from the wire contact 633A to a neighboring bonding pads 52A.

Embodiments of presented disclosure use an interconnection member to couple two semiconductor dies in a face to face dual die package (F2F DDP). Due to the absence of redistribution layer (RDL) formed on at least one the die, a manufacturing cost of the semiconductor package is reduced, and the product design complexity and the number of components for each semiconductor package is lowered.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor package, comprising:
    a package substrate;
    a first die disposed on the package substrate;
    a second die disposed over the first die;
    an interconnection member comprising:
        a first connection plate connected to the first die;
        a second connection plate connected to the second die; and
        a bump coupling the first connection plate and the second connection plate;
    a plurality of first bonding wires coupling the first connection plate to the first die;
    a plurality of second bonding wires coupling the second connection plate to the second die; and
    a plurality of third bonding wires coupling the first connection plate to the package substrate.

2. The semiconductor package of claim 1, wherein the first connection plate has a first through hole to expose one of a plurality of first bonding pads of the first die, and one of the first bonding wires passes through the first through hole for coupling one of the first bonding pads of the first die to the first connection plate.

3. The semiconductor package of claim 2, wherein the second connection plate has a second through hole to expose one of a plurality of second bonding pads of the second die, and one of the second bonding wires passes through the second through hole for coupling one of the second bonding pads of the second die to the second connection plate.

4. The semiconductor package of claim 3, wherein the first through hole is aligned with the second through hole in a direction that is perpendicular to the package substrate.

5. The semiconductor package of claim 3, wherein the first through hole is to expose the first bonding pads of the first die, and the second through hole is to expose the second bonding pads on the second die.

6. The semiconductor package of claim 1, wherein each of the first connection plate and the second connection plate comprises a supporting layer and an electrode disposed on the corresponding supporting layer.

7. The semiconductor package of claim 6, wherein the first connection plate and the second connection plate are respectively connected to the first die and the second die via an adhesive material.

8. The semiconductor package of claim 6, wherein the electrode of the first connection plate and the electrode of the second connection plate are connected to two sides of the bump.

9. The semiconductor package of claim 8, wherein the electrode of the first connection plate is connected to the package substrate via one of the third bonding wires and to the first die via one of the first bonding wires, and the electrode of the second connection plate is connected to the second die via one of the second bonding wires.

10. The semiconductor package of claim 1, further comprising an encapsulating material, and the first die, the second die, the interconnection member, the first bonding wires, the second bonding wires and the third bonding wires are encapsulated within the encapsulating material.

11. A method for manufacturing a semiconductor package, comprising:
providing a package substrate;
placing a first die on the package substrate;
placing a second die over the first die;
coupling the first die and the second die via an interconnection member, wherein a first connection plate of the interconnection member is connected to the first die, a second connection plate of the interconnection member is connected to the second die, and a bump of the interconnection member connects the first connection plate and the second connection plate;
coupling the first connection plate to the first die via a plurality of first bonding wires;
coupling the second connection plate to the second die via a plurality of second bonding wires; and
coupling the first connection plate to the package substrate via a plurality of third bonding wires.

12. The method for manufacturing a semiconductor package of claim 11, wherein one of the first bonding wires is formed from one of a plurality of first bonding pads of the first die to the first connection plate via a first through hole formed on the first connection plate.

13. The method for manufacturing a semiconductor package of claim 12, wherein one of the second bonding wires is formed from one of a plurality of second bonding pads of the second die to the second connection plate via a second through hole formed on the second connection plate.

14. The method for manufacturing a semiconductor package of claim 13, wherein the first through hole is aligned with the second through hole in a direction that is perpendicular to the package substrate.

15. The method for manufacturing a semiconductor package of claim 13, wherein the first through hole is to expose the first bonding pads of the first die, and the second through hole is to expose the second bonding pads on the second die.

16. The method for manufacturing a semiconductor package of claim 11, wherein each of the first connection plate and the second connection plate comprises a supporting layer and an electrode disposed on the corresponding supporting layer.

17. The method for manufacturing a semiconductor package of claim 16, wherein the first connection plate and the second connection plate are respectively connected to the first die and the second die via an adhesive material.

18. The method for manufacturing a semiconductor package of claim 16, wherein the electrode of the first connection plate and the electrode of the second connection plate are connected to two sides of the bump.

19. The method for manufacturing a semiconductor package of claim 18, wherein the electrode of the first connection plate is connected to the package substrate via one of the third bonding wires and to the first die via one of the first bonding wires, and the electrode of the second connection plate is connected to the second die via one of the second bonding wires.

20. The method for manufacturing a semiconductor package of claim 11, further comprising encapsulating the first die, the second die, the interconnection member, the first bonding wires, the second bonding wires and the third bonding wires by an encapsulating material.

\* \* \* \* \*